United States Patent [19]
Kuo

[11] Patent Number: 6,017,813
[45] Date of Patent: Jan. 25, 2000

[54] METHOD FOR FABRICATING A DAMASCENE LANDING PAD

[75] Inventor: Ming-Hong Kuo, Ping-Tung, Taiwan

[73] Assignee: Vanguard International Semiconductor Corporation, Hsin-Chu, Taiwan

[21] Appl. No.: 09/005,566

[22] Filed: Jan. 12, 1998

[51] Int. Cl.$^7$ ............................................. H01L 21/8242
[52] U.S. Cl. .................... 438/618; 438/597; 438/598; 438/453
[58] Field of Search .................... 438/618, 597, 438/598, 129, 584, 453, 253

[56] References Cited

U.S. PATENT DOCUMENTS

| 5,529,953 | 6/1996 | Shoda | 437/189 |
| 5,602,423 | 2/1997 | Jain | 257/752 |
| 5,614,765 | 3/1997 | Avanzino et al. | 257/774 |
| 5,622,883 | 4/1997 | Kim | 438/396 |
| 5,635,423 | 6/1997 | Huang et al. | 437/195 |
| 5,830,791 | 11/1998 | Lee et al. | 438/238 |
| 5,834,349 | 11/1998 | Tseng | 438/253 |
| 5,858,833 | 1/1999 | Lee et al. | 438/253 |
| 5,866,453 | 2/1999 | Prall et al. | 438/253 |

*Primary Examiner*—Charles Bowers
*Assistant Examiner*—Evan Pert
*Attorney, Agent, or Firm*—George O. Saile; Stephen B. Ackerman

[57] ABSTRACT

A process for forming a damascene landing pad structure, used to connect a bit line structure, of a semiconductor memory device, to an underlying source and drain region, of a transfer gate transistor, has been developed. The process features the formation of a dual shaped, landing pad opening in an insulator layer, comprised of a first shaped opening, exposing an underlying source and drain region, and an enlarged, second shape opening, exposing non-active device regions. Polysilicon deposition and patterning result in the formation of the damascene landing pad structure, in the dual shaped, landing pad opening. Insulator deposition is followed by the opening of a bit line via hole, exposing the top surface of the damascene landing pad structure, in a region in which the damascene landing pad structure overlays a non-active device region. This is followed by the formation of the bit line structure, contacting the top surface of the damascene landing pad structure, exposed in the bit line via hole.

11 Claims, 9 Drawing Sheets

FIG. 9B

METHOD FOR FABRICATING A DAMASCENE LANDING PAD

BACKGROUND OF THE INVENTION (1) Field of the Invention

The present invention relates to a method used to fabricate a semiconductor device, and more specifically to a method used to connect an overlying bit line structure to an underlying region of a transfer gate transistor.

(2) Description of Prior Art

The objective of increasing semiconductor device performance, while still reducing the manufacturing cost of these same devices, has been successfully addressed via micro-miniaturization, or the ability to fabricate semiconductor devices, with sub-micron features. Micro-miniaturization has been in part realized via advances in specific semiconductor fabrication disciplines such as photolithography and dry etching. The use of more sophisticated exposure cameras, as well as the use of more sensitive photoresist materials, have resulted in the routine attainment of sub-micron images in photoresist layers. In addition the development of more advanced dry etching tools, and processes, have allowed the sub-micron images in masking photoresist layers to be successfully transferred to underlying materials, used for the fabrication of semiconductor devices. However structural aspects of advanced semiconductor devices still have to be addressed to take advantage of micro-miniaturization.

One example of a structural component, needed to be addressed to benefit from micro-miniaturization, is the conductive structure, used to connect an overlying bit line structure, of a semiconductor memory device, to an underlying source and drain region of a transfer gate transistor. Several techniques, such as the use of a narrow polysilicon plug, placed between the bit line structure and the underlying source and drain region, have been used. However a placing of the narrow polysilicon plug, on the underlying source and drain region, and then overlaying a bit line structure on the underlying polysilicon plug structure, requires tight layer to layer, photolithographic overlay, sometimes difficult to achieve using sub-micron features. A conventional landing pad, placed on an underlying polysilicon plug structure, although allowing an easier target for placement of an overlying bit line structure, however results in an increase in step height, adversely influencing subsequent patterning procedures.

This invention will describe a process used to form a damascene landing pad, for use as the conductive connection between an overlying bit line structure, for a semiconductor memory device, and the underlying source and drain region of a transfer gate transistor. This invention will describe a first embodiment in which the design of the damascene landing pad contacts an underlying source and drain region, in an active device region of the semiconductor device, but also extends to overlay a non-active region of the semiconductor device, allowing this extended region of the damascene landing pad to be contacted by the overlying bit line structure. A second embodiment of this invention describes an enlarged region of the damascene landing pad, again overlying a non-active device region of the semiconductor device, and now allowing an easier target for the overlying bit line structure to find. Prior art such as Shoda, in U.S. Pat. No. 5,529,953, describes a process for forming both studs and interconnect structures, in an opening in an insulator layer. However that prior art does not describe the desired method of forming a damascene landing pad, with the desired extensions used for contact by an overlying bit line structure.

SUMMARY OF THE INVENTION

It is an object of this invention to create a conductive, damascene landing pad, in an insulator layer, used to connect an overlying bit line structure, of a semiconductor memory device, to an underlying source and drain region, of a transfer gate transistor.

It is another object of this invention to create a conductive, damascene landing pad in an insulator layer, designed with an extension of the landing pad, overlying a non-active device region of the semiconductor memory device, to be used for contact to a region of an overlying bit line structure.

It is still another object of this invention to create a conductive, damascene landing pad, in an insulator layer, designed with an enlarged area of the landing pad, overlying an isolation region of the semiconductor memory device, and used as the underlying pad, to accept contact from an overlying bit line structure.

In accordance with the present invention, a process is described for connecting an overlying bit line structure, of a semiconductor memory device, to a source and drain region of an underlying transfer gate transistor, via use of a conductive, damascene landing pad structure. A source and drain region, of a transfer gate transistor, is provided, located between silicon nitride encapsulated polysilicon gate structures. A first insulator layer is deposited, and patterned, via conventional photolithographic and anisotropic dry etch procedures, to create a landing pad opening in the first insulator layer. A first embodiment of this invention comprises the creation of a first portion of the landing pad opening, exposing a region of the source and drain region, of the transfer gate transistor, and a second portion of the landing pad opening, exposing a non-active, region, of the semiconductor memory device. A second embodiment of this invention comprises the creation of a first portion of the landing pad opening, again exposing the source and drain region of a transfer gate transistor, and an enlarged, second portion of the landing pad opening, exposing a non-active, isolation region of the semiconductor memory device. A first polysilicon layer is deposited, completely filling the landing pad openings in the first insulator layer. removal of the first polysilicon layer, from the surface of the first insulator layer, via anisotropic RIE, or chemical mechanical polishing procedures, results in the creation of a polysilicon, damascene landing pad structure, in the landing pad openings, with the polysilicon, damascene landing pad structure contacting the underlying source and drain region of the transfer gate transistor, and extending to overlay non-active, isolation regions. A second insulator layer is deposited, followed by the opening of a via hole in the second insulator layer, exposing the top surface of the polysilicon, damascene landing pad structure, in the region in which the polysilicon, damascene landing pad structure has been extended, or enlarged, to overlay the isolation region of semiconductor memory device. A second polysilicon layer, and a metal silicide layer, if desired, are next deposited, and patterned, to form a bit line structure, for the semiconductor memory device, contacting the extended, or enlarged portion, of the polysilicon, damascene landing pad structure, at the bottom of the via hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a damascene landing pad structure, used to connect a bit line structure, of a semiconductor memory device, to an underlying source and drain region of a transfer gate transistor, will now be described in detail. The damascene landing pad structure, described in this invention, is applied to a memory device, such as a DRAM type device, using an N channel, metal oxide semiconductor field effect transistor, (MOSFET), device. However the damascene landing pad structure, described in this invention, can be applied to other memory type devices, such as SRAM, or BiCMOS type devices, and can also be applied to P channel, MOSFET devices.

Figure 1A:
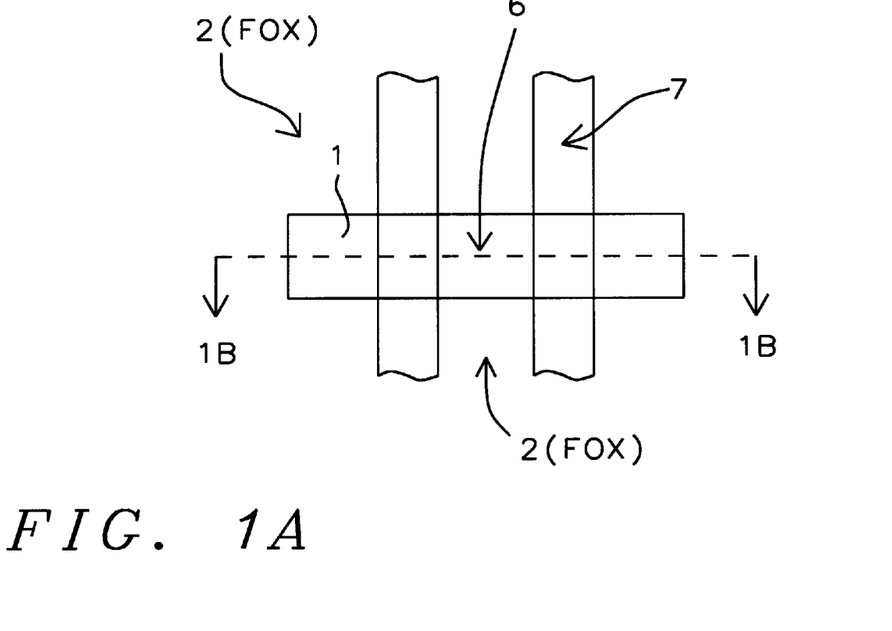
FIGS. 1A, 2A, 5A, 6A, which schematically show top views of a first embodiment of the damascene landing pad structure, at key stages of fabrication.
Figure 1B:
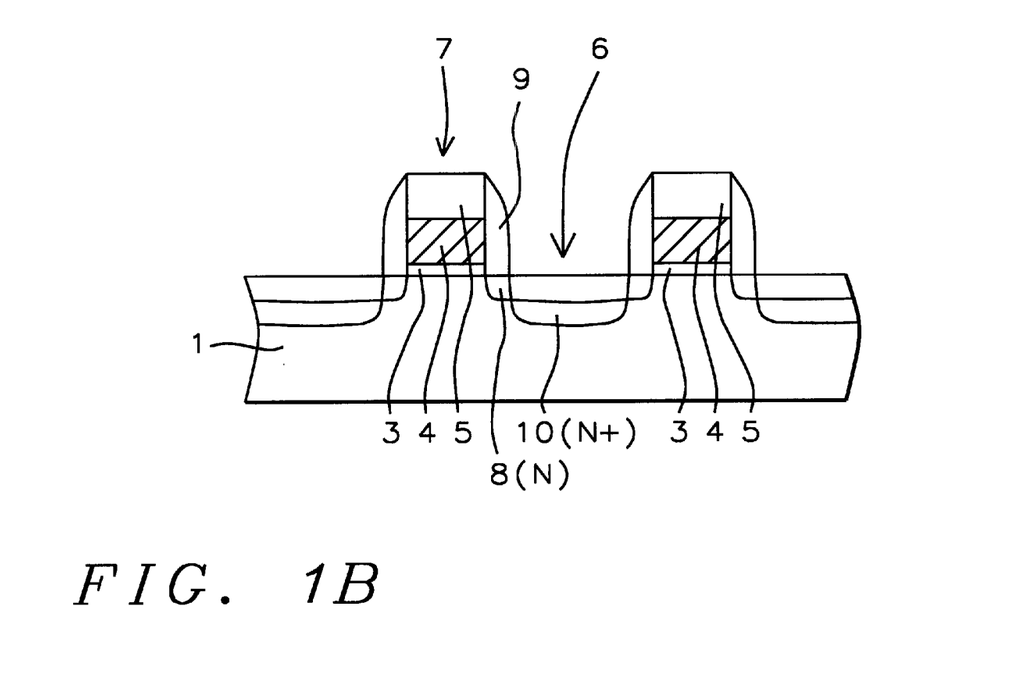
FIGS. 1B, 2B, 3, 4, 5B, 5C, 6B, schematically, in cross-sectional style, showing the first embodiment of the damascene landing pad structure, again at key stages of fabrication.

A P type, semiconductor substrate 1, comprised of single crystalline silicon, having a <100> crystallographic orientation, is used and shown schematically in FIG. 1B. Field oxide regions 2, used for isolation purposes, are created via thermal oxidation of select portions of semiconductor substrate 1, to a thickness between about 2000 to 4000 Angstroms. FOX regions 2, are shown schematically for the top view, in FIG. 1A. Referring again to FIG. 1B, a gate insulator layer 3, of silicon dioxide, is thermally grown to a thickness between about 45 to 300 Angstroms, followed by the deposition of a polysilicon layer 4, at a thickness between about 300 to 2000 Angstroms, using a low pressure chemical vapor deposition, (LPCVD), procedure. Polysilicon layer 4, is either in situ doped, via the addition of either arsine or phosphine, to silane ambient, or polysilicon layer 4, is deposited intrinsically, then doped via implantation of either phosphorous or arsenic ions. A tungsten silicide layer can be used in place of polysilicon layer 4, if desired, or a tungsten silicide layer can be used as an overlying layer, on polysilicon layer 4, used to create a subsequent polycide gate structure. The tungsten silicide layer, if used, is deposited, again using LPCVD procedures. A layer of silicon nitride 5, is next deposited, using LPCVD or plasma enhanced chemical vapor deposition, (PECVD), procedures, to a thickness between about 1000 to 3000 Angstroms.

The creation of the transfer gate transistors, used in this invention is next addressed via conventional photolithographic and anisotropic reactive ion etching, (RIE), procedures, using $CHF_3$ as an etchant for silicon nitride layer 5, while using $Cl_2$ as an etchant for polysilicon layer 4, creating polysilicon gate structures 7, schematically displayed in cross-sectional style in FIG. 1B, with the top view schematically shown in FIG. 1A. Space 6, between polysilicon gate structures 7, is also shown in FIG. 1A, and FIG. 1B. After removal of the photoresist shape, used for polysilicon gate structure patterning, via plasma oxygen ashing, and careful wet cleans, a lightly doped source and drain region 8, is formed via ion implantation of phosphorous or arsenic. Silicon nitride spacers 9, are next formed, at a thickness between about 500 to 2000 Angstroms, via deposition of a silicon nitride layer using either LPCVD or PECVD procedures, followed by an anisotropic RIE procedure, using $CHF_3$ as an etchant. A heavily doped source and drain region 10, is then formed, again via ion implantation of arsenic or phosphorous. The result of these procedures is schematically shown, in cross-sectional style, in FIG. 1B.

Figure 2A:
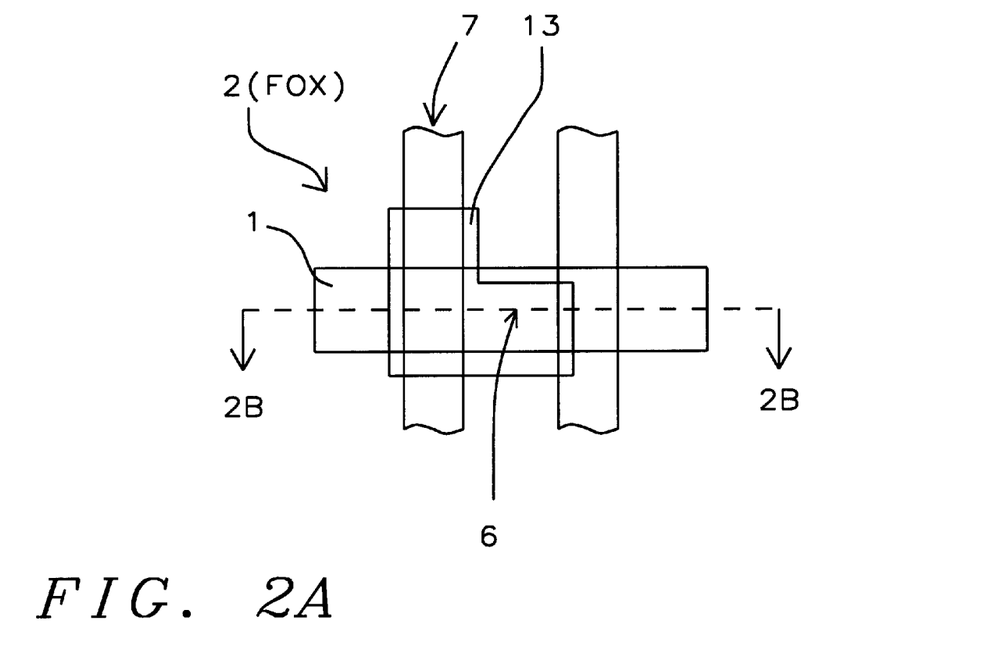
Figure 2B:
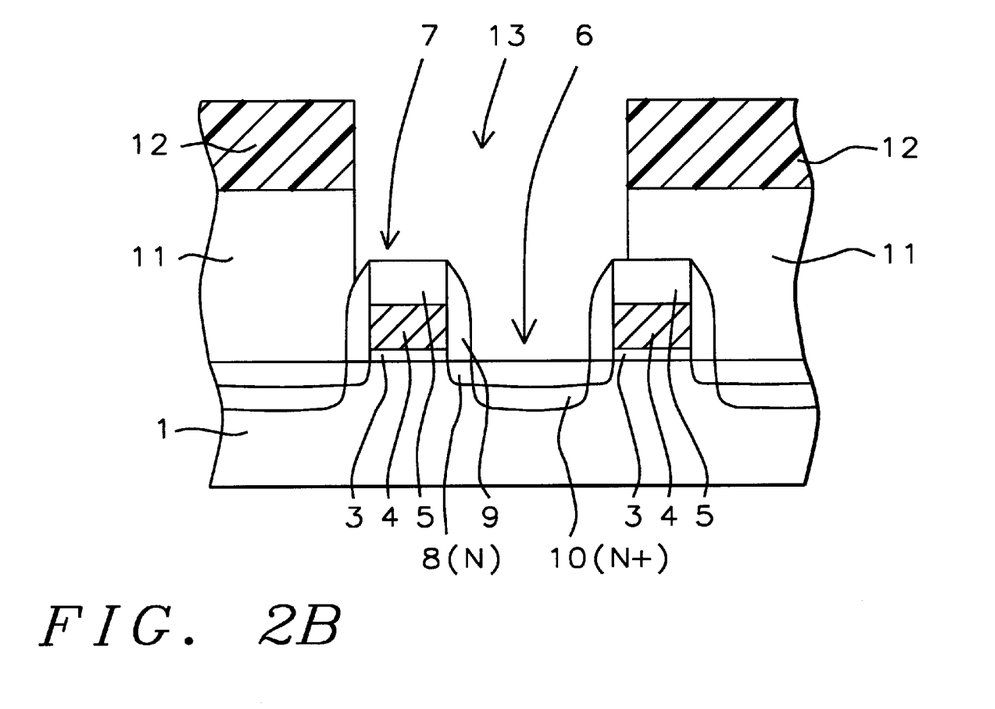

A first insulator layer 11, of silicon oxide, is deposited using LPCVD or PECVD procedures, to a thickness between about 2000 to 9000 Angstroms. A photoresist shape 12, with an opening 13, is used as a mask to allow landing pad opening 13, to be formed in first insulator layer 11, via an anisotropic RIE procedure, using $CHF_3$ as an etchant. This is schematically shown in the top view of FIG. 2A, and in the cross-sectional view of FIG. 2B. Landing pad opening 13, is comprised of a first portion, exposing underlying source and drain region 10, in space 6, between polysilicon gate structures 7, schematically shown in cross-sectional style in FIG. 2B, and for the top view in FIG. 2A. In addition landing pad opening 13, as shown in FIG. 2A, is also comprised of a second portion, exposing FOX isolation region 2, and polysilicon gate structure 7, encapsulated with silicon nitride spacers 9, and silicon nitride layer 5.

Figure 3:
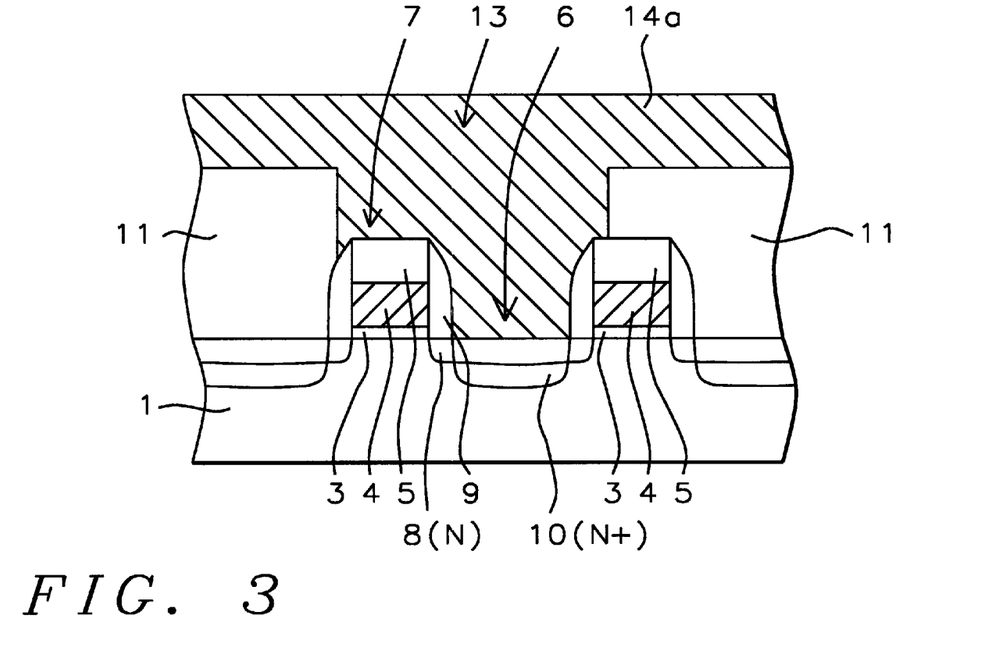
Figure 4:
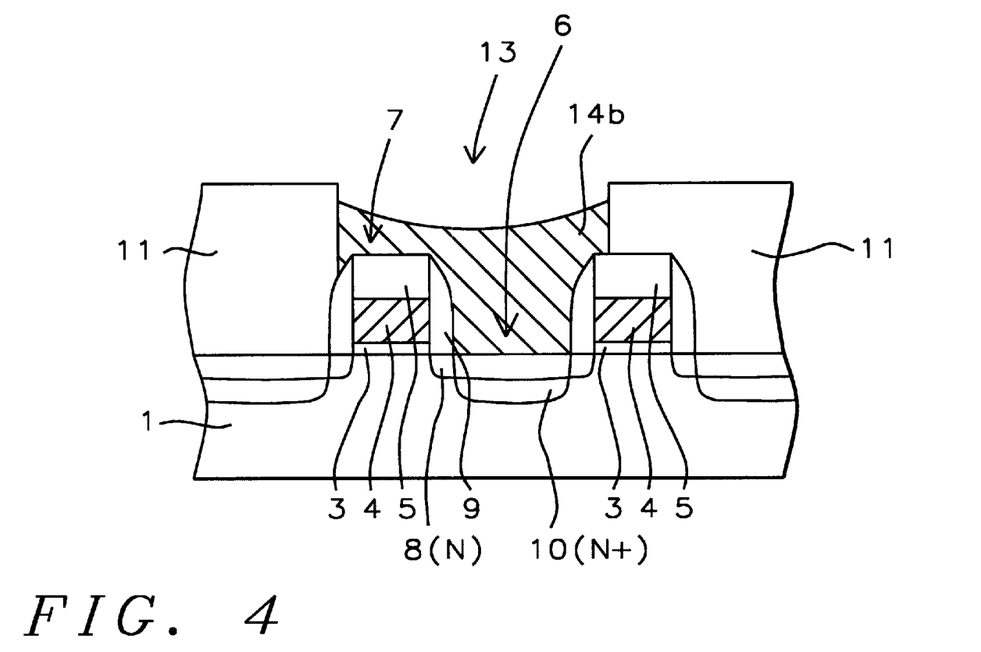

After removal of photoresist shape 12, via plasma oxygen ashing and careful wet cleans, a polysilicon layer 14a, is next deposited using LPCVD procedures, to a thickness between about 1000 to 7000 Angstroms, completely filling landing pad opening 13, in first insulator layer 11. Polysilicon layer 14a, is doped either during deposition via an in situ doping procedure, via the addition of either arsine or phosphine, to a silane ambient, or polysilicon layer 14a, can be deposited intrinsically and then doped using ion implantation procedures. This is schematically shown in FIG. 3. Removal of unwanted portions of polysilicon layer 14a, overlying the top surface of first insulator layer 11, is accomplished using either a selective RIE procedure, using $Cl_2$ as an etchant, or via the use of a chemical mechanical polishing, (CMP), procedure, creating damascene landing pad structure 14b, in landing pad opening 13, contacting underlying source and drain region 10, in space 6, between polysilicon gate structures 7, schematically shown in FIG. 4.

Figure 5A:
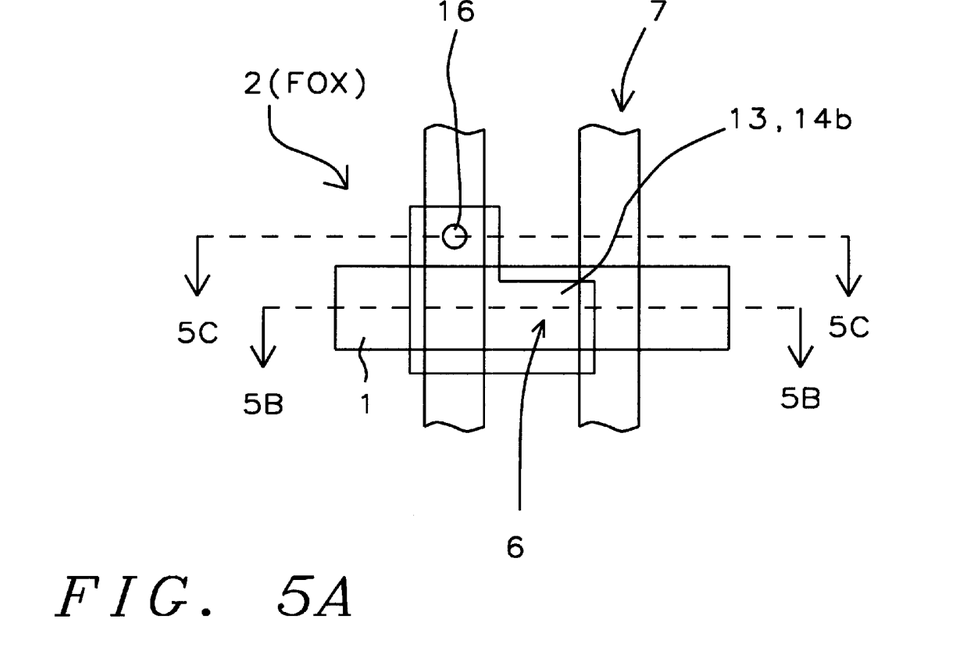
Figure 5B:
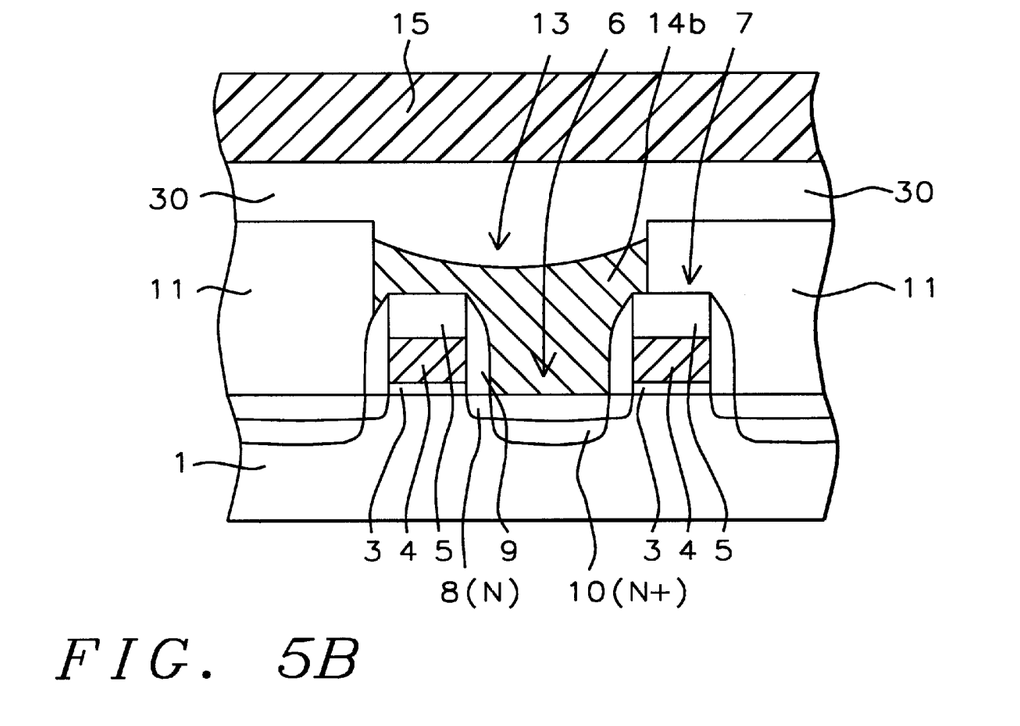
Figure 5C:
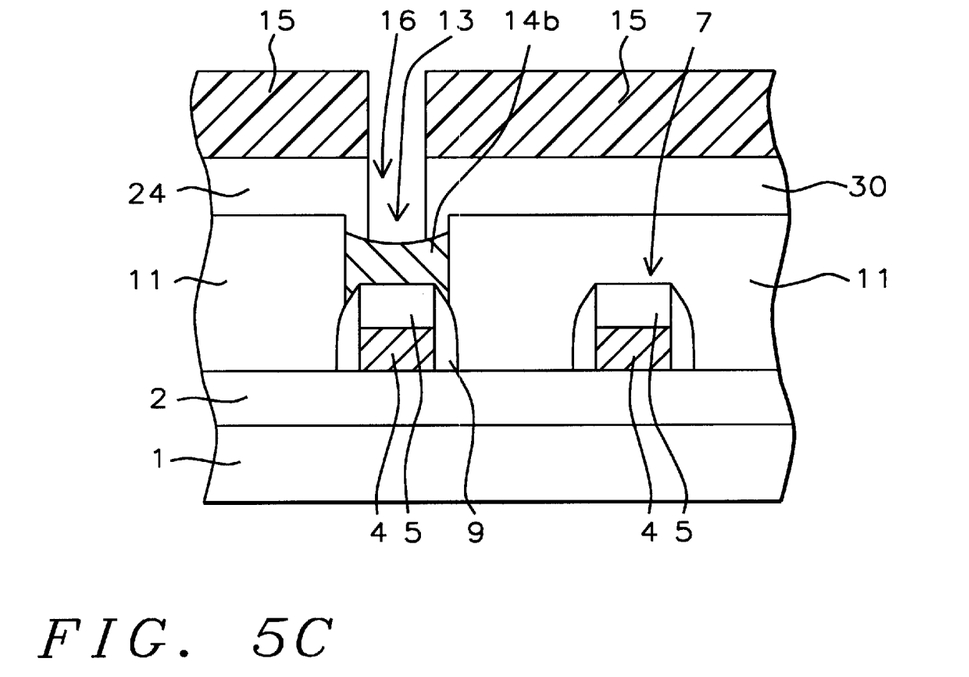

A second insulator layer 30, of silicon oxide, is next deposited using either LPCVD or PBECVD procedures, to a thickness between about 500 to 3000 Angstroms, shown schematically in FIGS. 5B and 5C. A photoresist shape 15, shown in FIGS. 5B and 5C, is applied, and used as a mask to open bit line via hole 16, in second insulator layer 30, exposing the top surface of damascene landing pad structure 14b, schematically shown in the top view of FIG. 5A, and in the cross-sectional view of FIG. 5C. However bit line via hole 16, as shown in FIG. 5A, is formed only over a region of damascene landing pad structure 14b, which extends over a non-active region of semiconductor substrate 1. This is possible as a result of previously creating landing pad opening 13, with the second portion of landing pad opening 13, extending to overlay non-active regions.

Figure 6A:
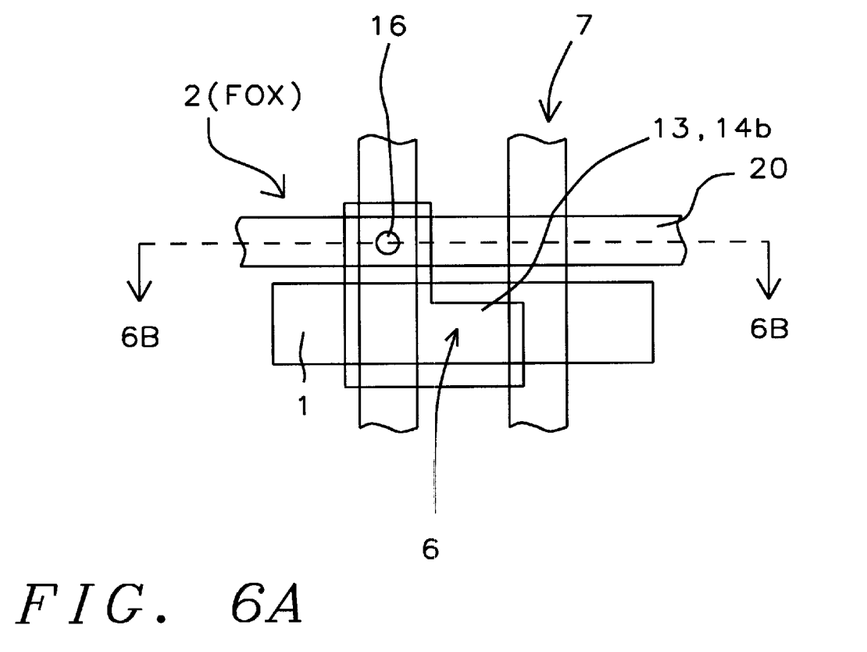
Figure 6B:
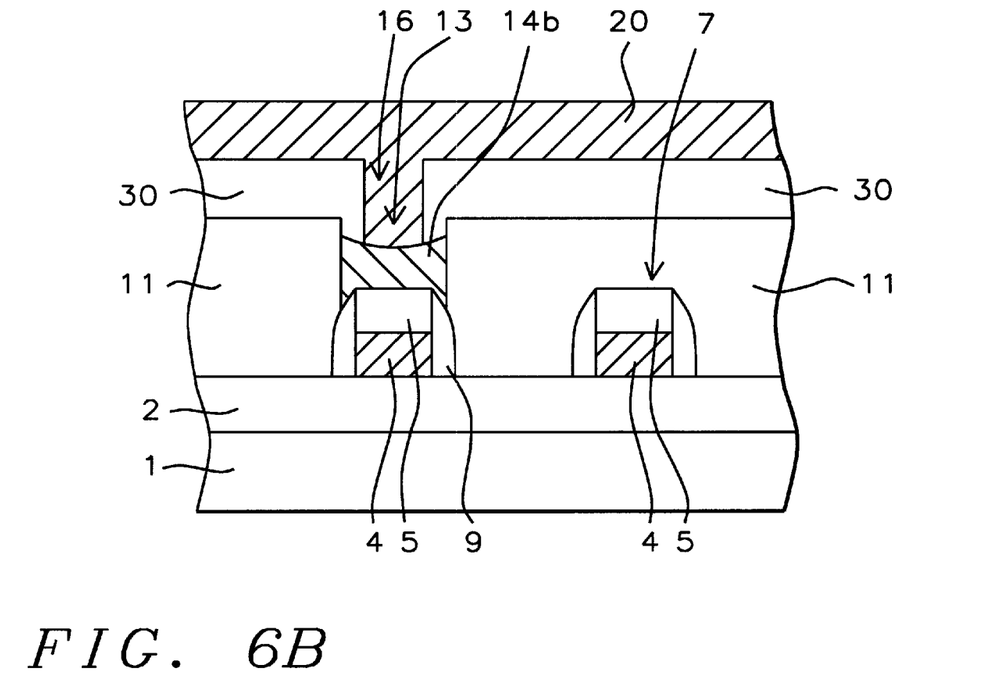

After removal of photoresist shape 15, via plasma oxygen ashing and careful wet cleans, a polysilicon layer is deposited via LPCVD procedures, to a thickness between about 500 to 3000 Angstroms, completely filling bit line via hole 16. The polysilicon layer is again doped either during deposition via an in situ doping procedure, by the addition of either arsine or phosphine, to a silane ambient, or the polysilicon layer can be deposited intrinsically and ion implanted with either arsenic or phosphorous ions. If desired a layer of tungsten silicide, obtained via LPCVD procedures, to a thickness between about 500 to 3000 Angstroms, can be used overlying the polysilicon layer for purposes of increasing the conductivity of the subsequent bit line structure. Conventional photolithographic and RIE procedures, using $Cl_2$ as an etchant, are used to create the bit line structure 20, schematically shown, in cross-sectional style in FIG. 6B, and schematically shown in the top view of FIG. 6A, contacting the top surface of damascene landing pad 14b, in bit line via hole 16. Photoresist removal is once again accomplished using plasma oxygen ashing and careful wet cleans. The top view, shown in FIG. 6A, features the bit line structure 20, contacting the top surface of the damascene landing pad structure 14b, in the region in which damascene landing pad 14b, overlays a non-active region, of the semiconductor memory device, made possible by forming landing pad opening 13, with the extended opening over the non-active regions.

Figure 7A:
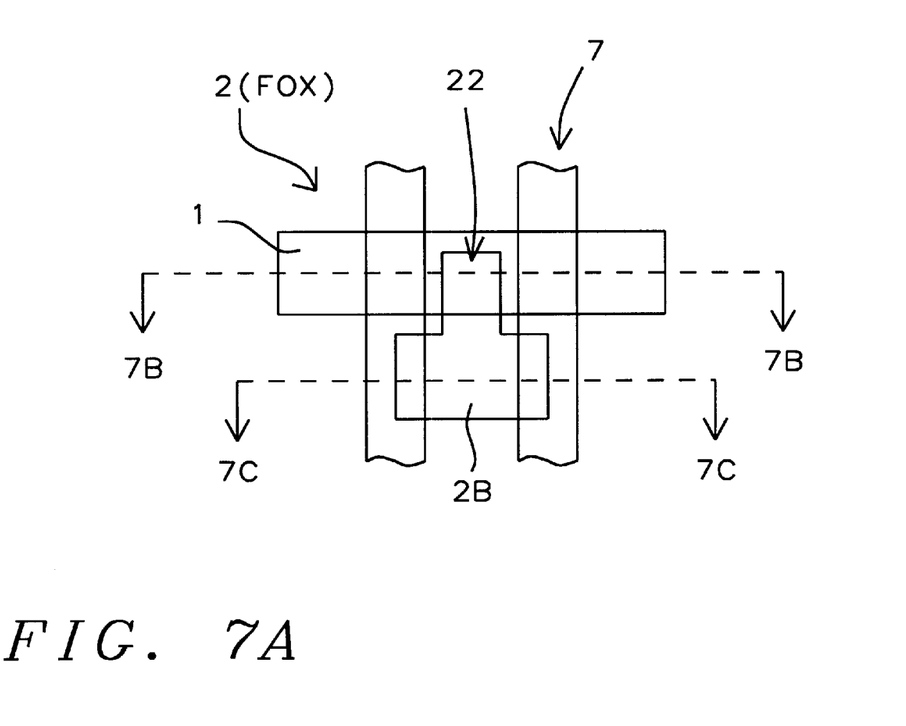
FIGS. 7A, 9A, which schematically show top views of a second embodiment of the damascene landing pad structure, at key stages of fabrication.
Figure 7B:
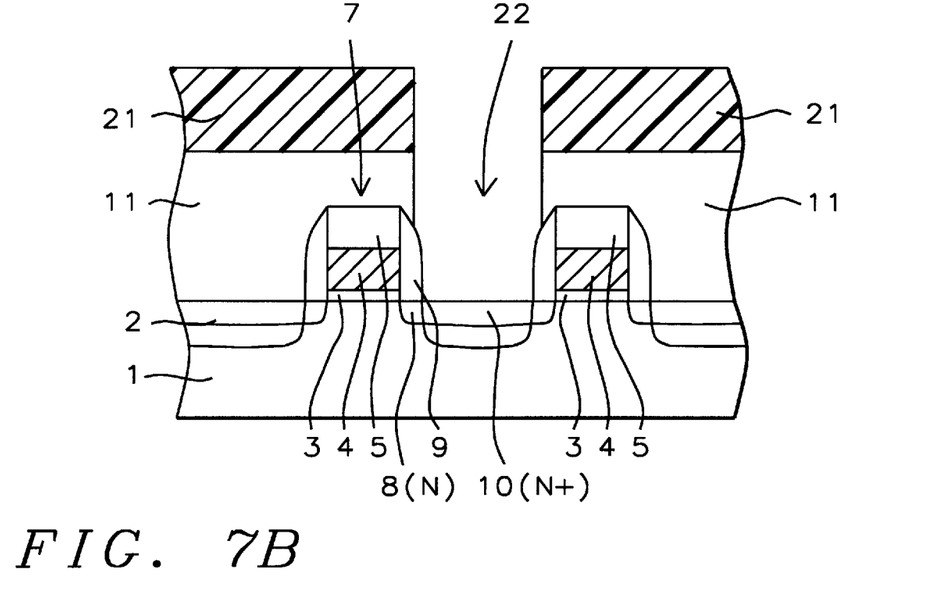
FIGS. 7B, 7C, 8, 9B, schematically, in cross-sectional style, showing the second embodiment of the damascene landing pad structure, at key fabrication stages.
Figure 7C:
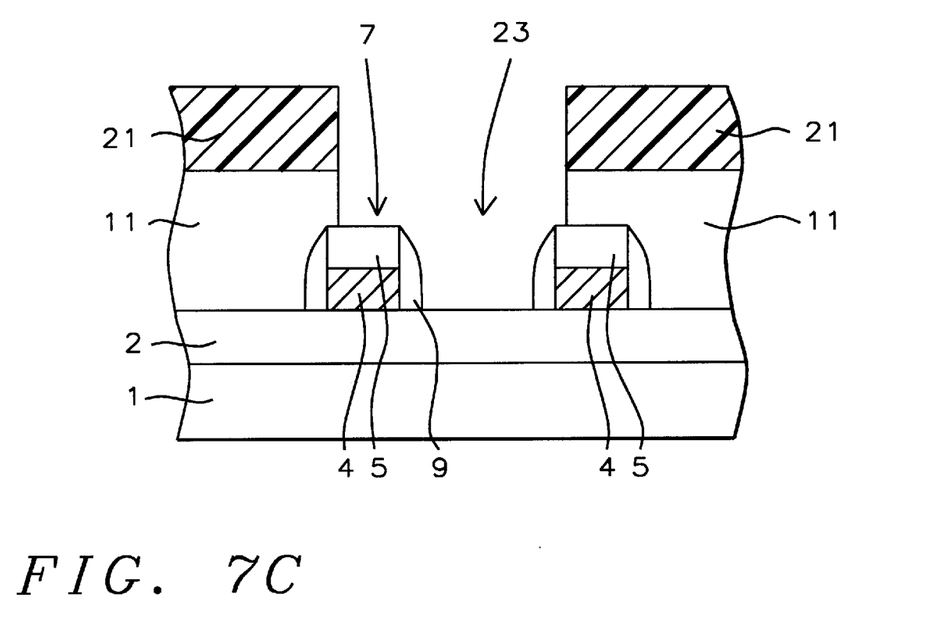
Figure 8:
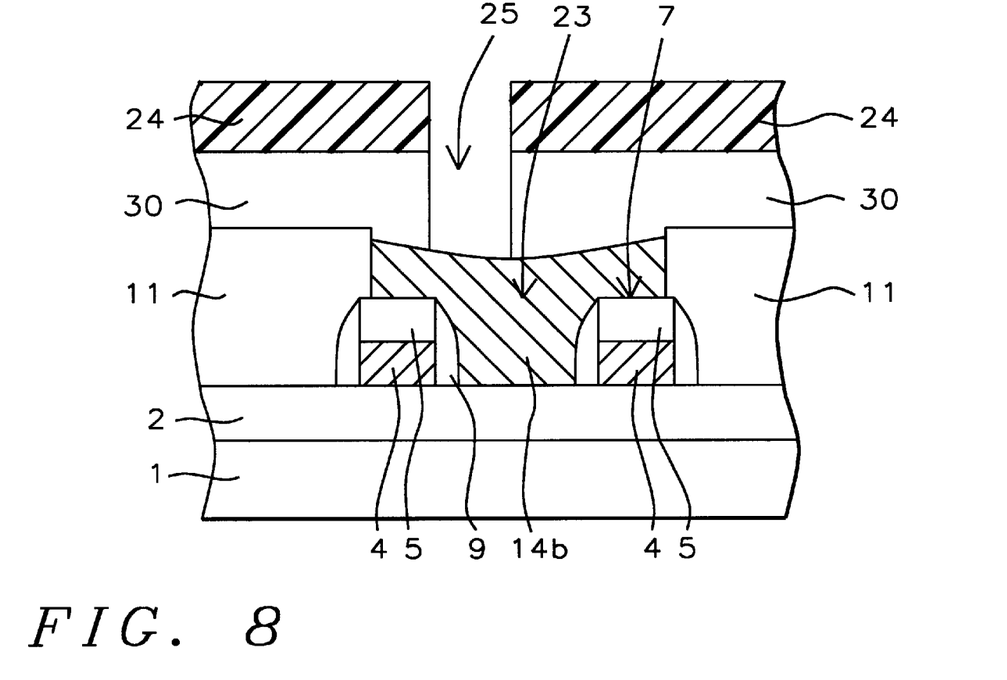

A second embodiment of this invention features the formation of a landing pad opening, in first insulator layer 11, with the landing pad opening comprised of a first portion of the landing pad opening 22, exposing underlying source and drain region 10, shown schematically in FIGS. 7A and 7B, and a second, enlarged portion of landing pad opening 23, exposing non-active, FOX region 2, shown schematically in top view 7a, and cross-sectionally in FIG. 7C. The landing pad opening was again formed via anisotropic RIE of first insulator layer 11, using $CHF_3$ as an etchant, and using photoresist shape 21, as an etch mask. After removal of photoresist shape 21, via plasma oxygen ashing and careful wet cleans, a damascene landing pad structure 14b, is formed. Damascene landing pad structure 14b, is formed in landing pad opening, which is comprised of a first portion 22, and of an enlarged second portion 23. Damascene landing pad structure 14b, is formed using the identical polysilicon deposition and patterning procedures used for the first embodiment of the invention, a polysilicon deposition, and patterning via either anisotropic RIE or CMP procedures. This is schematically shown in FIG. 8. A second insulator layer 30, is again deposited, using conditions and thickness, identical to those used for the first embodiment of this invention, followed by the creation of bit line via hole 25, formed via an anisotropic RIE of second insulator layer 30, using $CHF_3$ as an etchant, to a region exposed in the opening in photoresist shape 24, and schematically shown in FIG. 8. Bit line via hole 25, is opened, exposing the top surface of damascene landing pad 14b, in a region in which damascene landing pad structure 14b, resides in the enlarged, second portion 23, of the landing pad opening. This is shown schematically in the top view of FIG. 9A.

Figure 9A:
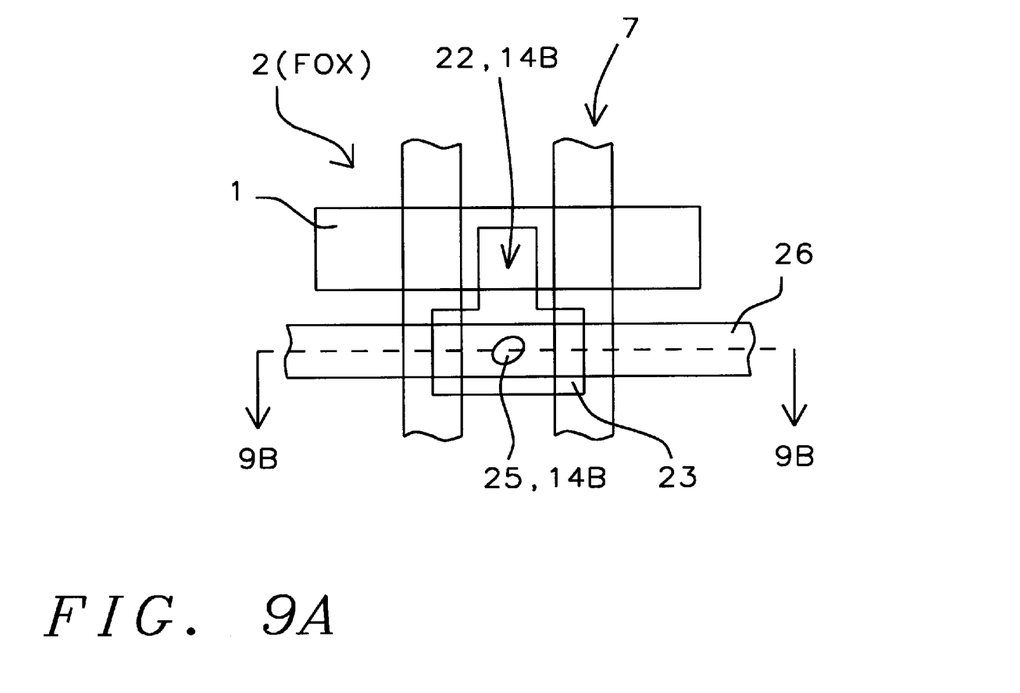
Figure 9B:
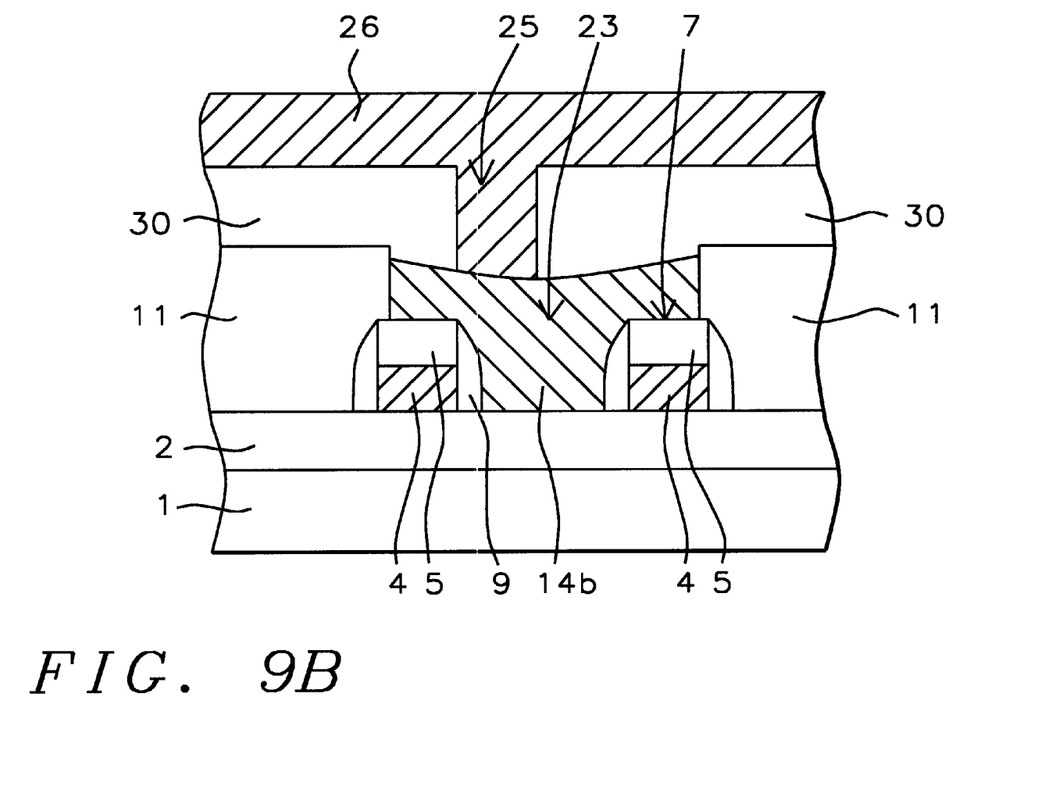

After removal of photoresist shape 24, via plasma oxygen ashing and careful wet cleans, bit line structure 26, is formed, contacting underlying damascene landing pad structure 14b, at the bottom of bit line via hole 25. This is schematically shown, in cross-sectional style in FIG. 9B. FIG. 9A shows the top view of the bit line structure 26, contacting underlying damascene landing pad structure, in a region in which damascene landing pad structure 14b, overlays the enlarged, second portion 23, of the landing pad opening. The bit line structure 26, is comprised of the materials, and formed using the same process, as described for the first embodiment.

While this invention has been particularly shown and described with reference to the preferred embodiments thereof, it will be understood by those skilled in the art that various changes inform and details may be made without departing from the spirit and scope of this invention.

What is claimed is:

1. A method for fabricating a dual shaped, damascene landing pad structure, for a semiconductor memory device, on a semiconductor substrate, with a first shape of said damascene landing pad structure contacting an underlying source and drain region of a transfer gate transistor, and with a bit line structure contacting top surface of an enlarged, second shape of said dual shaped damascene landing pad structure, comprising the steps of:

providing transfer gate transistors, comprised of polysilicon gate structures, with an overlying silicon nitride layer, and silicon nitride sidewall spacers, on a gate insulator layer, with said source and drain region between said polysilicon gate structures;

depositing a first silicon oxide layer;

forming a dual shaped landing pad opening, in said first silicon oxide layer, comprised of said first shape, of said dual shaped landing pad opening, exposing said source and drain region, between said polysilicon gate structures, and comprised of said enlarged, second shape, of said dual shaped landing pad opening, wider in width than said first shape, of said dual shaped landing pad opening, exposing a silicon nitride encapsulated, polysilicon gate structure, and exposing a field oxide region;

depositing a first polysilicon layer, on the top surface of said first silicon oxide layer, and completely filling said dual shaped landing pad opening, in said first silicon oxide layer;

removing said first polysilicon layer from said top surface of said first silicon oxide layer, forming said damascene landing pad structure, in said dual shaped landing pad opening, with said damascene landing pad, in said first shape of said dual shaped landing pad opening, contacting said source and drain region, while said damascene landing pad structure, in said enlarged, second shape of said dual shaped landing pad opening, overlays said silicon nitride encapsulated polysilicon gate structure, and overlays said field oxide region;

depositing a second silicon oxide layer;

opening a bit line via hole in said second silicon oxide layer, exposing a portion of the top surface of said damascene landing pad structure, in a region in which said damascene landing pad structure resides in said enlarged, second shape of said dual shaped landing pad opening;

depositing a second polysilicon layer on the top surface of said second silicon oxide layer, and completely filling said bit line via hole;

depositing a metal silicide layer; and patterning of said metal silicide layer, and of said second polysilicon layer, to create said bit line structure, contacting said portion of top surface of said damascene landing pad structure, in a region in which said damascene landing pad structure resides in said enlarged, second shape of said dual shaped landing pad opening.

2. The method of claim 1, wherein said first silicon oxide layer is deposited using LPCVD or PECVD procedures, to a thickness between about 2000 to 9000 Angstroms.

3. The method of claim 1, wherein said dual shaped landing pad opening, is created in said first silicon oxide layer, via an anisotropic RIE procedure, using $CHF_3$ as an etchant.

4. The method of claim 1, wherein said first polysilicon layer is deposited using LPCVD procedures, to a thickness between about 1000 to 7000 Angstroms.

5. The method of claim 1, wherein said damascene landing pad structure is formed via removal of said first polysilicon layer, from said top surface of said first silicon oxide layer, via an anisotropic RIE procedure, using $Cl_2$ as an etchant.

6. The method of claim 1, wherein said damascene landing pad structure is formed via removal of said first polysilicon layer, from said top surface of said first silicon oxide layer, via a CMP procedure.

7. The method of claim 1, wherein said second silicon oxide layer is deposited using LPCVD or PECVD procedures, to a thickness between about 500 to 3000 Angstroms.

8. The method of claim 1, wherein said bit line via hole is opened in said second silicon oxide layer via an anisotropic RIE procedure, using $CHF_3$ as an etchant.

9. The method of claim 1, wherein said second polysilicon layer is deposited using LPCVD procedures, to a thickness between about 500 to 3000 Angstroms.

10. The method of claim 1, wherein said metal silicide layer is tungsten silicide, deposited using LPCVD procedures, to a thickness between about 500 to 3000 Angstroms.

11. The method of claim 1, wherein said bit line structure is formed via an anisotropic RIE procedure, using $Cl_2$ as an etchant for said metal silicide layer, and for said second polysilicon layer.

* * * * *